(12) United States Patent
Ou et al.

(10) Patent No.: US 8,728,892 B2
(45) Date of Patent: May 20, 2014

(54) ADAPTIVE FIN DESIGN FOR FINFETS

(75) Inventors: Tsong-Hua Ou, Taipei (TW); Shu-Min Chen, Yongkang (TW); Pin-Dai Sue, Tainan (TW); Li-Chun Tien, Tainan (TW); Ru-Gun Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 106 days.

(21) Appl. No.: 13/101,890

(22) Filed: May 5, 2011

(65) Prior Publication Data

US 2012/0280331 A1     Nov. 8, 2012

(51) Int. Cl.
*H01L 21/336*     (2006.01)

(52) U.S. Cl.
USPC ............... 438/279; 257/401; 257/E29.026

(58) Field of Classification Search
USPC ........................................................ 438/696
See application file for complete search history.

(56) References Cited

U.S. PATENT DOCUMENTS

| 2009/0224396 | A1* | 9/2009 | Becker | 257/691 |
| 2010/0025767 | A1* | 2/2010 | Inaba | 257/365 |
| 2010/0287518 | A1* | 11/2010 | Becker | 716/9 |

\* cited by examiner

*Primary Examiner* — Daniel Whalen
(74) *Attorney, Agent, or Firm* — Slater and Matsil, L.L.P.

(57) ABSTRACT

A method of designing a standard cell includes determining a minimum fin pitch of semiconductor fins in the standard cell, wherein the semiconductor fins are portions of FinFETs; and determining a minimum metal pitch of metal lines in a bottom metal layer over the standard cell, wherein the minimum metal pitch is greater than the minimum fin pitch. The standard cell is placed in an integrated circuit and implemented on a semiconductor wafer.

9 Claims, 12 Drawing Sheets

ADAPTIVE FIN DESIGN FOR FINFETS

BACKGROUND

In the recent development of integrated circuit design, standard cells may include fin field-effect transistors (FinFETs) therein. A FinFET may include a plurality of semiconductor fins, and a gate electrode formed thereon and crossing the plurality of semiconductor fins. Accordingly, the drive current of the FinFET is the sum of the drive currents of the plurality of semiconductor fins.

In conventional design flow of the standard cells comprising FinFETs, design rules are first established. The fin pitch is determined as being equal to the metal pitch of metal lines in a bottom metal layer. Placement and route constraints are also established. Standard cells may then be designed according to the design rules, the fin pitch and the metal pitch, and the placement and route constraints. After the standard cells are designed, the performance of the standard cells is checked. If the performance does not meet the design requirement, the standard cells are re-designed by adding fin numbers and/or adding cell pitch numbers. If the performance meets the design requirement, the gate density of the standard cells is checked against design requirements. If the gate density satisfies the design requirements, the circuit design is ended. Otherwise, a redesign is performed, and the fin numbers of the standard cells may be reduced, and/or the circuit performance target may be lowered.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method of designing standard cells and the resulting standard cells are provided in accordance with an embodiment. The variations of the embodiment are then discussed. Throughout the various views and illustrative embodiments, like reference numbers are used to designate like elements.

Figure 1:
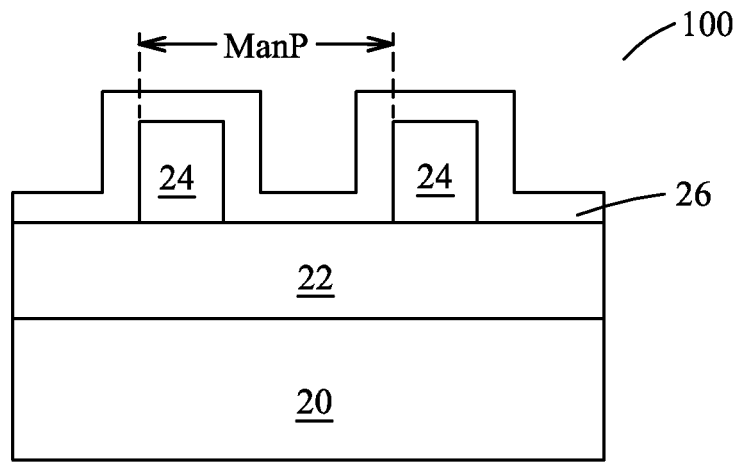
FIGS. 1 through 5 are cross-sectional views of intermediate stages in the manufacturing of Fin field-effect transistors (FinFETs) using mandrels in accordance with an embodiment.

FIGS. 1 through 6 illustrate a schematic process for forming semiconductor fins (also referred to as fins hereinafter). FIGS. 1 through 5 are cross-sectional views. Referring to FIG. 1, semiconductor wafer 100 comprising semiconductor substrate 20 is provided. Semiconductor substrate 20 may be formed of silicon or other commonly used semiconductor materials. Hard mask layer 22 is formed over semiconductor substrate 20. In an embodiment, hard mask layer 22 is a composite layer comprising a plurality of dielectric layers, such as a plasma enhanced oxide layer, a silicon oxynitride layer, an amorphous carbon layer, and/or the like. Mandrels (which are sacrificial patterns) 24 are formed on hard mask layer 22, followed by the blanket formation of spacer layer 26, which is formed on the top surfaces and the sidewalls of mandrels 24. In an exemplary embodiment, mandrels are formed of silicon nitride, although other materials may also be used. Mandrels 24 have pitch ManP.

Figure 2:
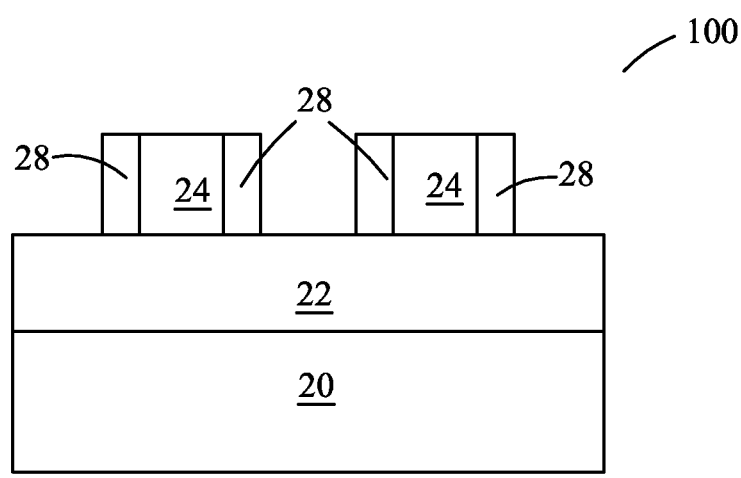
Figure 3:
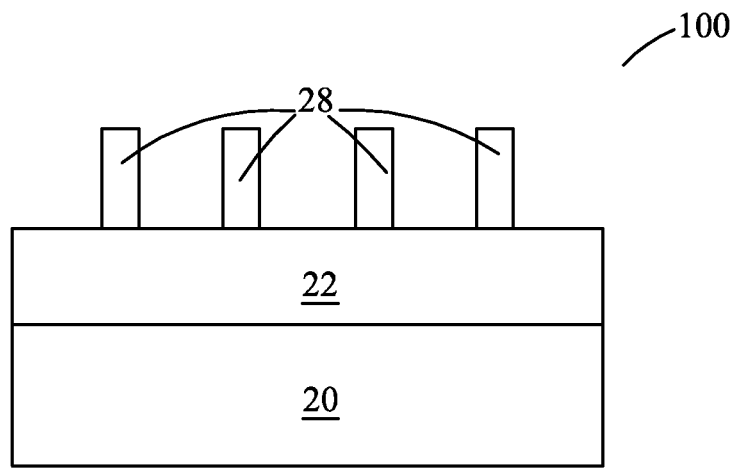
Figure 4:
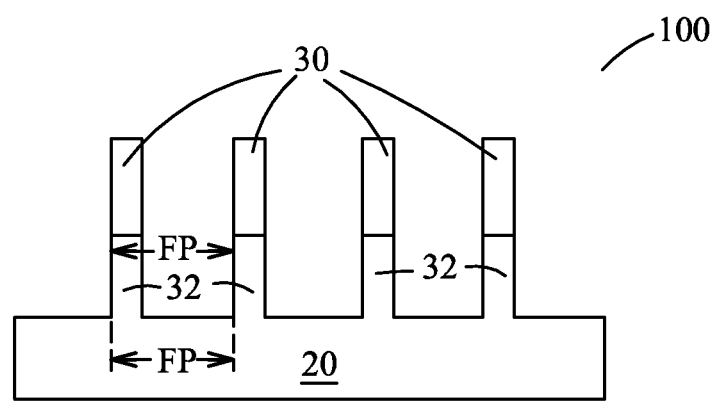

Referring to FIG. 2, spacer layer 26 is etched, so that the horizontal portions of spacer layer 26 are removed, and the vertical portions of spacer layer 26 on the sidewalls of mandrels 24 are left to form spacers 28. Next, as shown in FIG. 3, mandrels 24 are removed by etching, and spacers 28 are left un-removed. Spacers 28 are then used as masks to etch hard mask layer 22 in order to form hard masks 30, as shown in FIG. 4. Spacers 28 are then removed, and substrate 20 is etched using hard mask 30. The resulting remaining top portions of semiconductor substrate 20 form fins 32. On average, pitch FP of fins 32 is reduced to a half of pitch ManP of mandrels 24 in FIG. 1.

Figure 5:
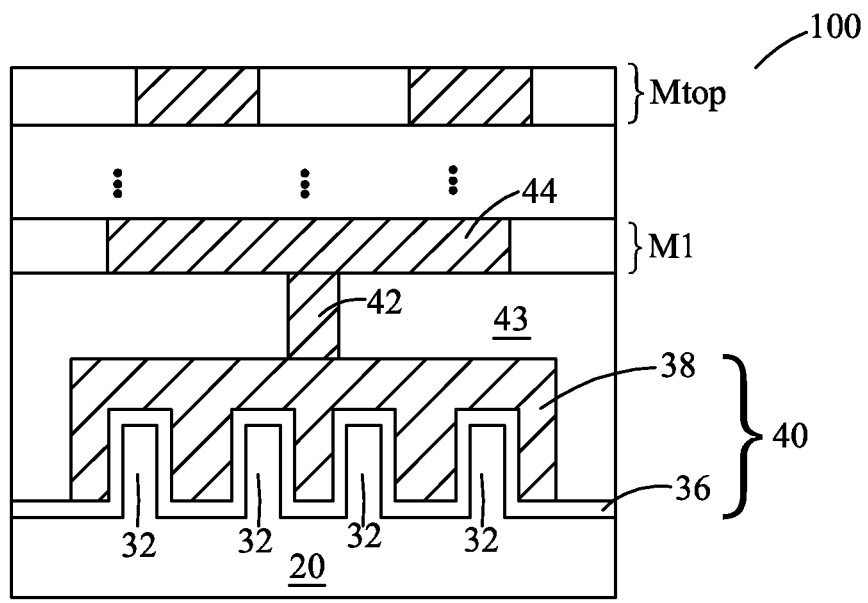

FIG. 5 illustrates the formation of FinFET 40, which includes forming a gate dielectric layer 36 on the top surfaces and sidewalls of a plurality of fins 32. Gate electrode 38 is then formed, and may be formed directly over a plurality of fins 32. Accordingly, FinFET 40 is formed. Next, interlayer dielectric (ILD) 43 is formed to cover FinFET 40, and contact plug 42 is formed to electrically connect to gate electrode 38. In subsequent steps, a plurality of metal layers including M1 through Mtop is formed, which includes metal lines (such as 44) that may be electrically connected to gate electrode 38. Metal layer M1 is the bottom metal layer immediately over contact plug 42, with no additional metal layer(s) therebetween. In bottom metal layer M1, metal line 44 is formed as a part of bottom metal layer M1, and is electrically connected to gate electrode 38. Metal layer M1 may include a plurality of metal lines (also designated as 44 as shown in FIG. 6).

Figure 6:
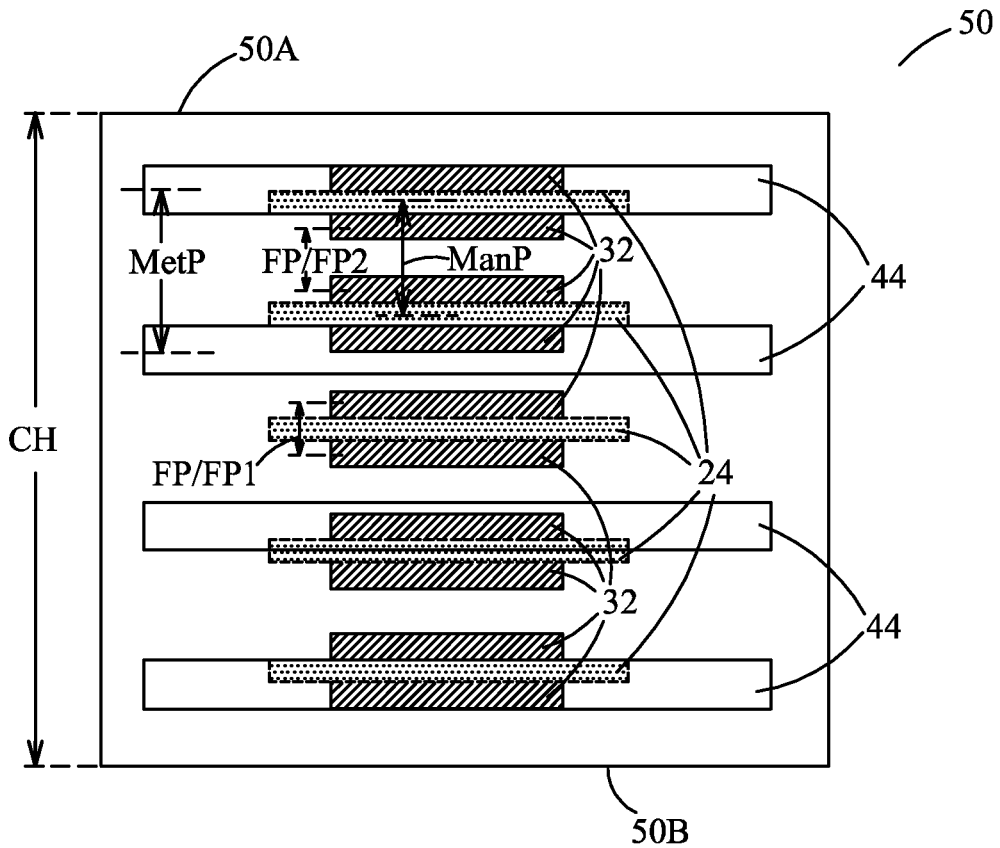
FIG. 6 illustrates a top view of the mandrels, the fins, and metal lines shown in FIGS. 1 through 5.

FIG. 6 illustrates an exemplary top view of the positions of the likely formed metal lines 44 and fins 32. It is appreciated that at the time fins 32 and metal lines 44 are formed, mandrels 24 have been removed already. Accordingly, mandrels 24 are illustrated using dashed line to mark their positions. In an embodiment, metal lines 44 may be aligned to grid lines of a grid (not shown in FIG. 6, please refer to FIG. 13) having a uniform spacing MetP. Accordingly, the pitches of metal lines 44 in metal layer M1 are fixed, and are referred to as minimum metal pitch MetP throughout the description. It is noted that not all grid lines have metal lines formed thereon, and metal lines 44 may have pitches equal to multiple (integer) times, such as two times, three times, and so on, of minimum metal pitch MetP. Throughout the description, when fin pitch FP, mandrel pitch ManP, and metal pitches MetP are referred to, they represent the respective minimum pitches, not the multiples of the respective minimum pitches.

Fins 32 have minimum fin pitch FP. In an embodiment, minimum fin pitch FP is not equal to, and may be smaller than or greater than, minimum metal pitch MetP. It is observed that fins 32 may include fin pitch FP1 defined by two fins formed from the same mandrel 24, and fin pitch FP2 defined by two fins formed from neighboring mandrels 24. Fin pitch FP1 may be different from fin pitch FP2, although they may be substantially equal to each other, for example, with a difference smaller than five percent of each of fin pitches FP1 and FP2. Fin pitches FP1 and FP2 may also be equal to each other. Throughout the description, the term "fin pitch FP" may refer to either FP1 or FP2.

FIGS. 7A through 13 illustrate various implementations of fins 32 in standard cells 50, and the respective mandrels 24 for forming fins 32. As shown in FIGS. 1 through 4, mandrels 24 are sacrificial features for forming fins 32, and may not coexist in the same structure as fins 32. However, in FIGS. 7A through 13, mandrels 24 and fins 32 are both illustrated to indicate their possible locations and relative positions. In addition, mandrels 24 and fins 32 actually indicate candidate locations of the respective mandrels 24 and fins 32, and at any of the illustrated locations, there may, or may not, be mandrels 24 and fins 32 formed. However, if mandrels 24 and fins 32 are formed, they will be formed at the illustrated locations. In each of FIGS. 7A through 13, mandrels 24 and fins 32 are illustrated as extending substantially from one boundary line of standard cell 50 to an opposite boundary line. The actual mandrels 24 and fins 32 may, or may not, be shorter, and may be fully inside the respective standard cell 50. Furthermore, in the embodiments, the term "cell height" refers to the dimension of standard cell 50 measured in the direction perpendicular to the lengthwise directions of parallel fins 32. For example, in FIG. 6, cell height CH is the distance between boundary line 50A and 50B of standard cell 50. In some embodiments, cell height CH may be expressed as:

$$CH = N*MetP \qquad [\text{Eq. 1}]$$

wherein N is a positive integer. In alternative embodiments, cell height CH may be expressed as:

$$CH = (N+0.5)*MetP \qquad [\text{Eq. 2}]$$

Figure 7A:
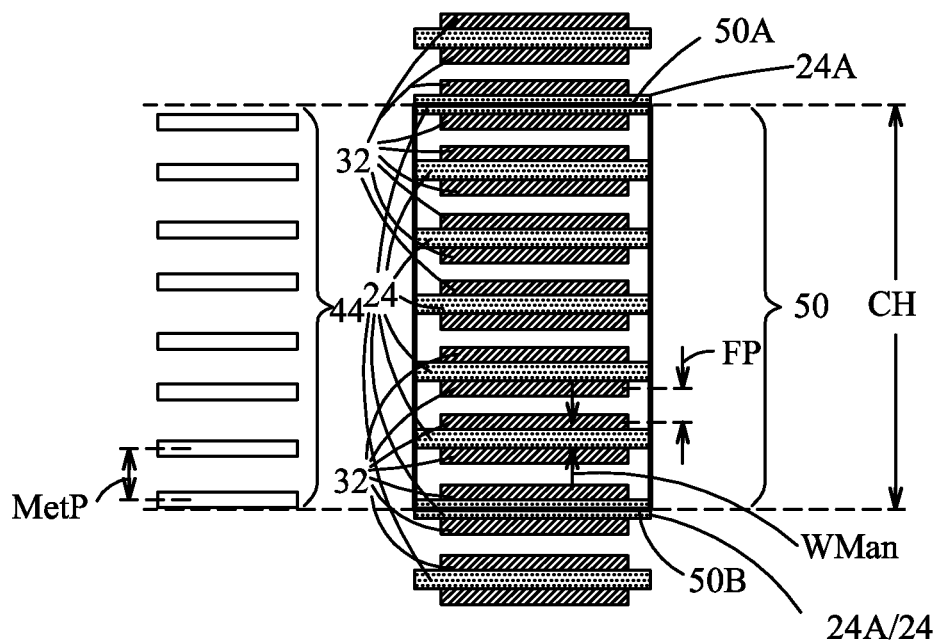
FIGS. 7A through 13 are top views of possible positions of semiconductor fins in standard cells.
Figure 7B:
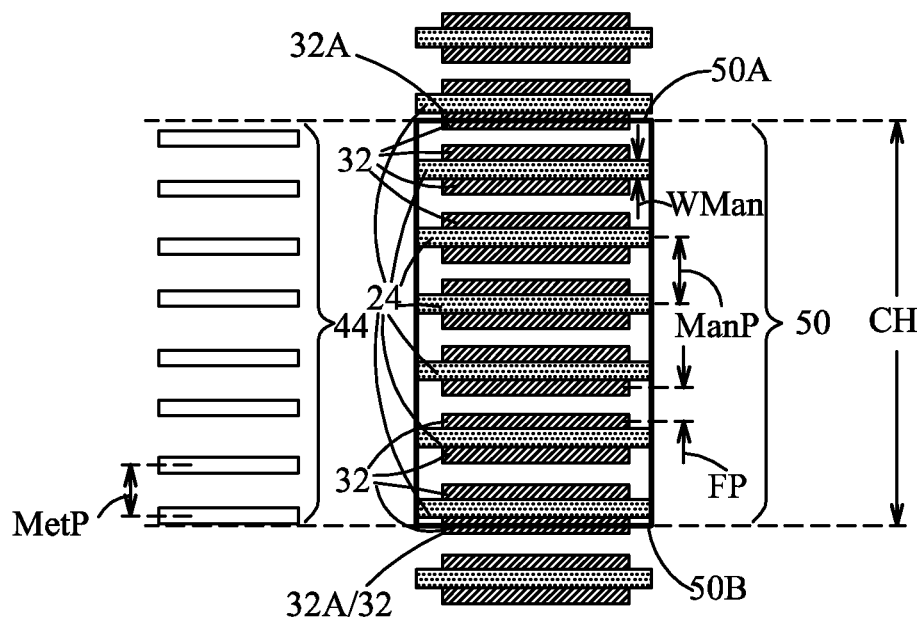
Figure 7C:
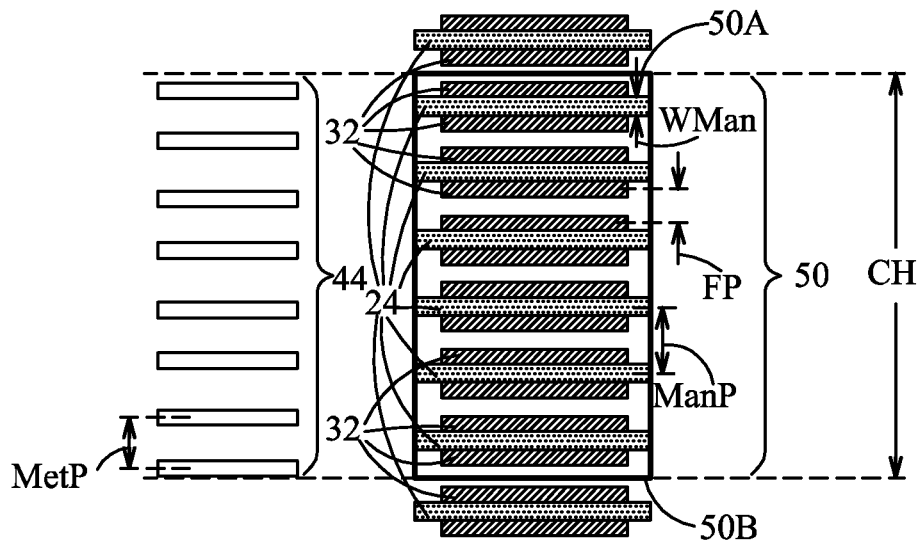

FIGS. 7A through 7C illustrate embodiments wherein fins 32 are formed through formula-based fin pitch optimization. In each of FIGS. 7A through 12, metal lines 44 that are illustrated aside of standard cell 50 are actually directly over the illustrated fins 32 and inside standard cell 50. In the embodiments shown in FIGS. 7A through 7C, cell height CH is dividable by fin pitch FP with no remainder. Accordingly, combined with Equation 1, the following expression may exist:

$$(TN*MetP)/FP = FN \qquad [\text{Eq. 3}]$$

Wherein TN is the number of metal tracks (on which metal lines 44 are formed) between boundaries 50A and 50B, and FN is the maximum number of fins 32 that can be accommodated by cell height CH. Throughout the description, FN is also referred to as a fin number or a maximum fin number. In an exemplary embodiment, metal pitch MetP is 64 nm, and TN is 9. Accordingly, if fin pitch FP is 64 nm, the respective fin number FN is 9. Alternatively, if fin pitch FP is 48 nm, the respective fin number FN is (64×9)/48=12. Accordingly, by de-bonding fin pitch FP and metal pitch MetP, and allowing fin pitch FP not equal to metal pitch MetP, fin pitch FP may be set to smaller than FP so that more fins 32 may be designed in standard cell 50.

In FIGS. 7A, 7B, and 7C, mandrels 24 have equal pitches ManP and equal widths WMan. Since fin pitch FP may be equal to or smaller than metal pitch MetP, the maximum fin number FN that can be accommodated by standard cell 50 may be equal to or greater than maximum metal number TN. FIGS. 7A, 7B, and 7C are slightly different from each other in that in FIG. 7A, there are two mandrels 24A on boundary lines 50A and 50B, while there is no fin 32 on boundary lines 50A and 5B. In FIG. 7B, fins 32A are on boundary lines 50A and 50B, while there is no mandrel 24 on boundary lines 50. In FIG. 7C, none of mandrels 24 and fins 32 crosses boundary lines 50A and 50B.

Figure 8A:
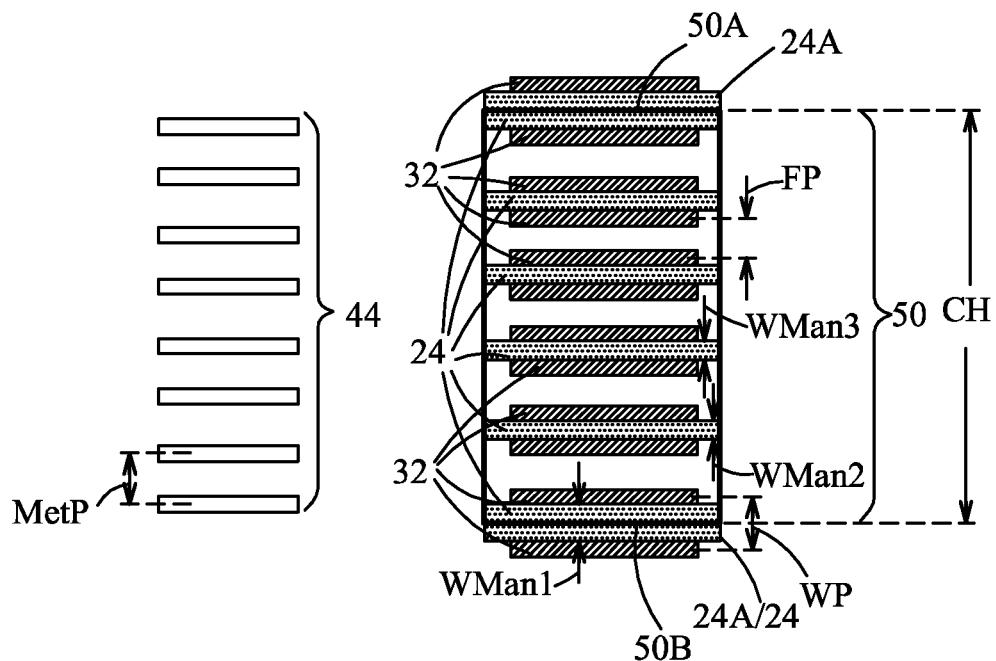
Figure 8B:
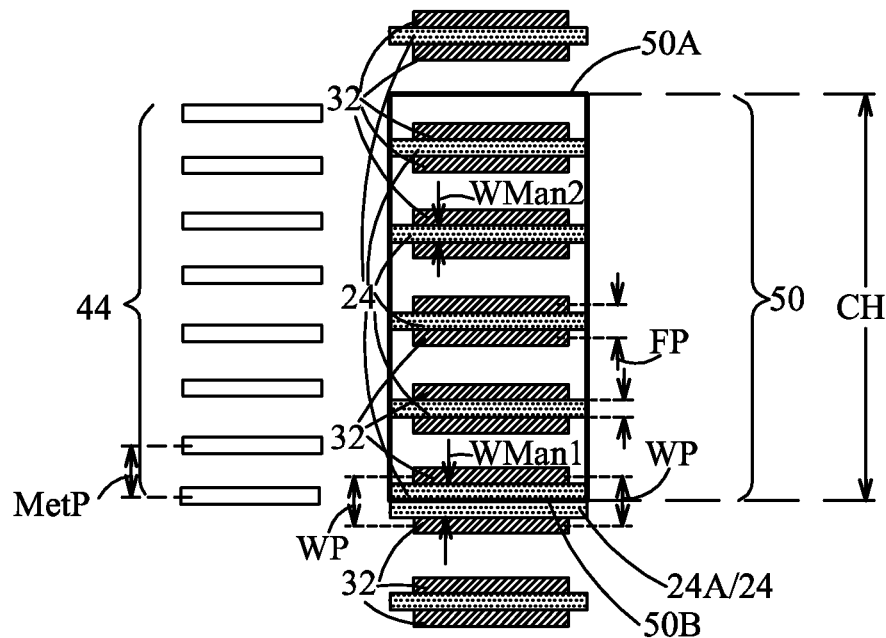
Figure 8C:
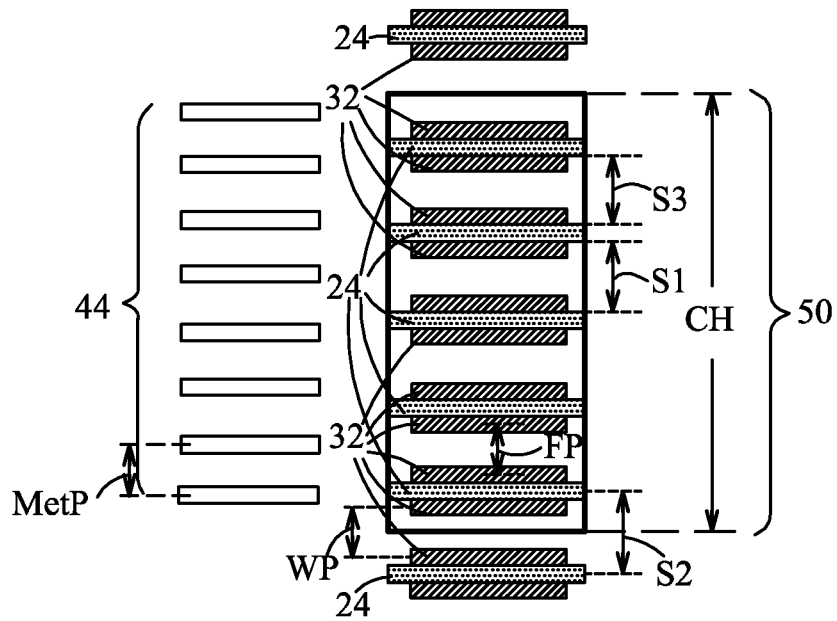

FIGS. 8A, 8B, and 8C illustrate embodiments wherein fins 32 are formed through formula-based fin pitch optimization, while cell height CH is not dividable by fin pitch FP. Alternatively stating, when cell height CH is divided by fin pitch FP, there is a remainder smaller than fin pitch FP. Combined with Equation 1, the following expression may exist:

$$TN*MetP = (FN-1)*FP + WP \qquad [\text{Eq. 4}]$$

Wherein TN is the number of metal tracks (on which metal lines 44 are formed) between boundaries 50A and 50B, FN is the maximum fin number that can be accommodated by cell height CH, and WP has the value greater than FP and smaller than 2FP. WP may be the pitch of a boundary fin 32 and a fin 32 in a cell neighboring cell 50, while the internal fins 32 inside cell 50 have smaller pitches FP. Again, in FIGS. 8A, 8B, and 8C, fin pitch FP may be equal to or smaller than metal pitch MetP, and hence the maximum fin number FN accommodated by cell 50 may be equal to or greater than the metal number TN of metal lines 44. In the embodiments shown in FIGS. 8A and 8B, wide mandrels 24A are designed to increase the fin pitch of boundary fins 32 from FP to WP. In the embodiment shown in FIG. 8C, wide spacings may be allocated to the fins 32 that are inside standard cell 50, or alternatively, to the fins 32 that are closest to boundary lines 50A and/or 50B. In some embodiments, spacing S2, which is between a mandrel inside standard cell 50 and a mandrel outside standard cell 50, may be greater than spacing S1, which is between two mandrels inside standard cell 50. In alternative embodiments, spacing S3, which is also between two mandrels inside standard cell 50, is greater than another spacing S1 that is also between two mandrels inside standard cell 50. Furthermore, in FIG. 8A, wide mandrel 24A is formed on boundary 50A, but not on the opposite boundary 50B, of cell 50, with internal mandrels 24 having width WMan2 smaller than the width WMan1 of boundary mandrel 24A. Alternatively, a wide mandrel may also be located inside a standard cell. For example, FIG. 8A schematically illustrates a mandrel having width WMan3 greater than width WMan2.

In the design of standard cells, the determination of fin number FN and fin pitch FP may be formula-based as shown in equations 1 through 4. Alternatively, fin number FN and fin pitch FP, and the corresponding metal track number TN may be pre-determined to form a table, and in the integrated circuit design process, fin number FN and fin pitch FP are selected from the table. Table 1 illustrates an exemplary table.

TABLE 1

| | Candidate FP when MetP = 64 nm | Candidate FP when MetP = 70 nm |
|---|---|---|
| TN = 9 | FP = 48 | FP = 42 |
| TN = 10 | FP = 48 + WP | FP = 50 |
| TN = 11 | FP = 44 | FP = 42 + WP |

The rows of marked as TN=9, TN=10, and TN=11 indicate the candidate cell height CH of the respective cell, wherein cell height CH equals the respective metal track number times metal pitch MetP. The columns represent the candidate fin pitch FP. It is realized that Table 1 may be further expanded when more MetP values are designated.

In the table-based fin pitch design, wide pitch WP, for example, as in table 1 may be designed as wide mandrels, as shown in FIG. 8B. Alternatively, wide pitch WP is implemented using wide spacing, as shown as spacings S2 and S3 in FIG. 8C.

Figure 9:
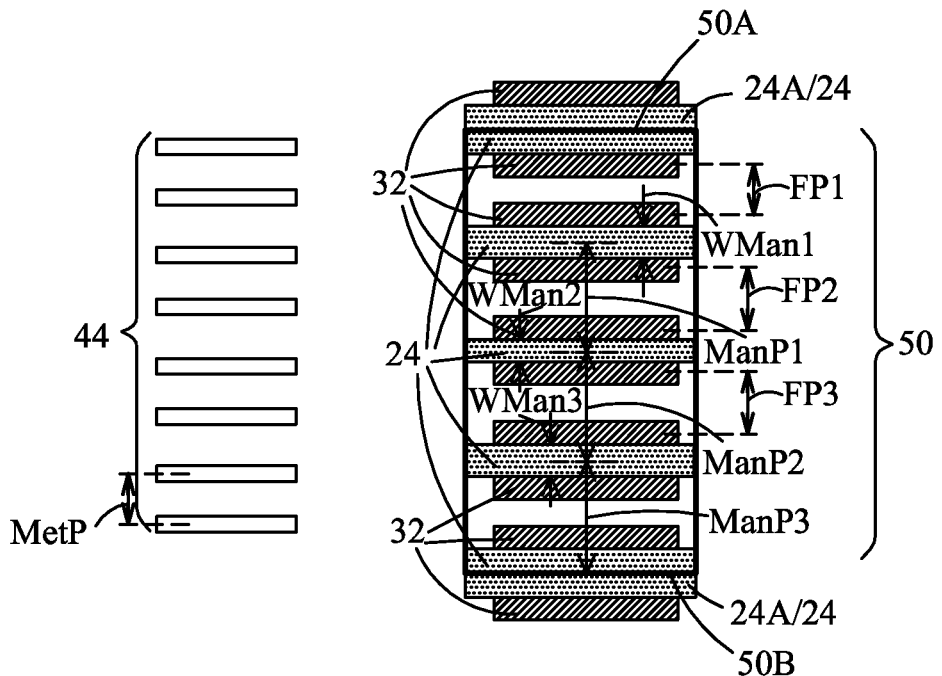

Besides the formula-based and table-based cell design, fin pitch FP may be model-based. In the model based design, fin pitch FP, mandrel pitch ManP, and width WMan of mandrels 24 are determined by using design optimization models, which may be run on simulators. As a result, as shown in FIG. 9, there may be a plurality of fin pitches such as FP1, FP2, and FP3 that are different from each other in the same standard cell 50. Furthermore, there may be a plurality of mandrel pitches such as ManP1, ManP2, and ManP3 that are different from each other in the same standard cell 50. Widths WMan1, WMan2, WMan3 of mandrels 24 may also be different from each other. Again, As a result of the table-based design as shown in Table 1 and the model-based design, fin pitch FP may be equal to or smaller than metal pitch MetP, and hence maximum fin number FN accommodated by cell 50 may be equal to or greater than maximum metal number MetP.

Figure 10A:
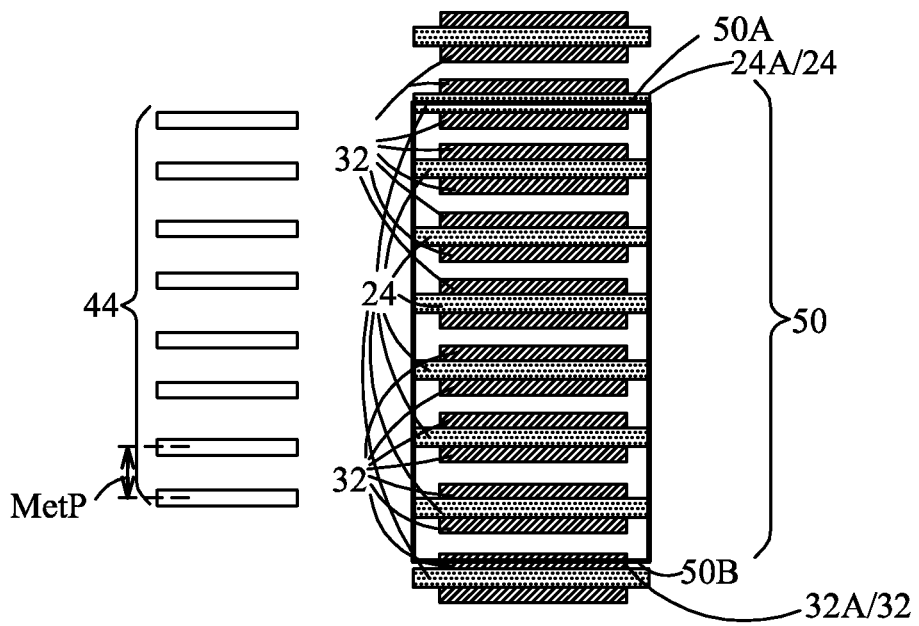
Figure 10B:
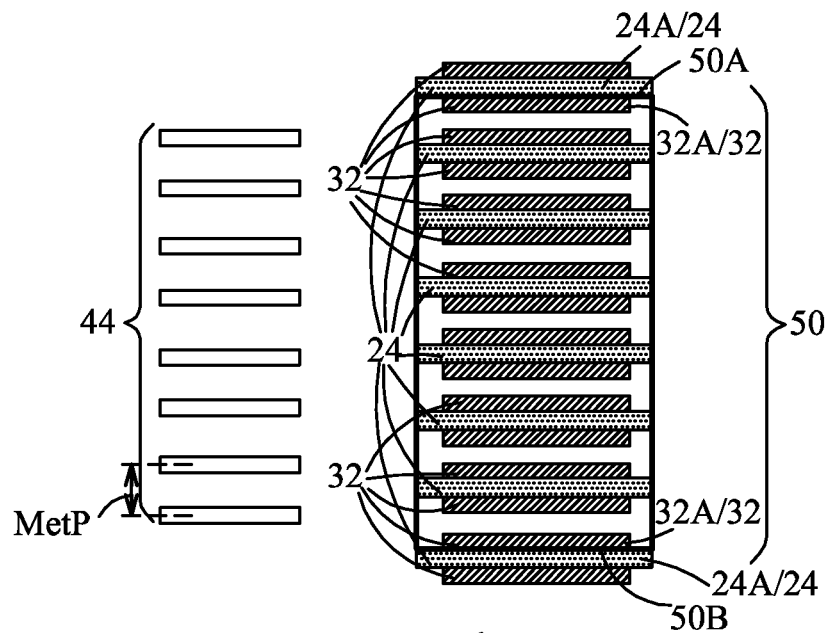
Figure 10C:
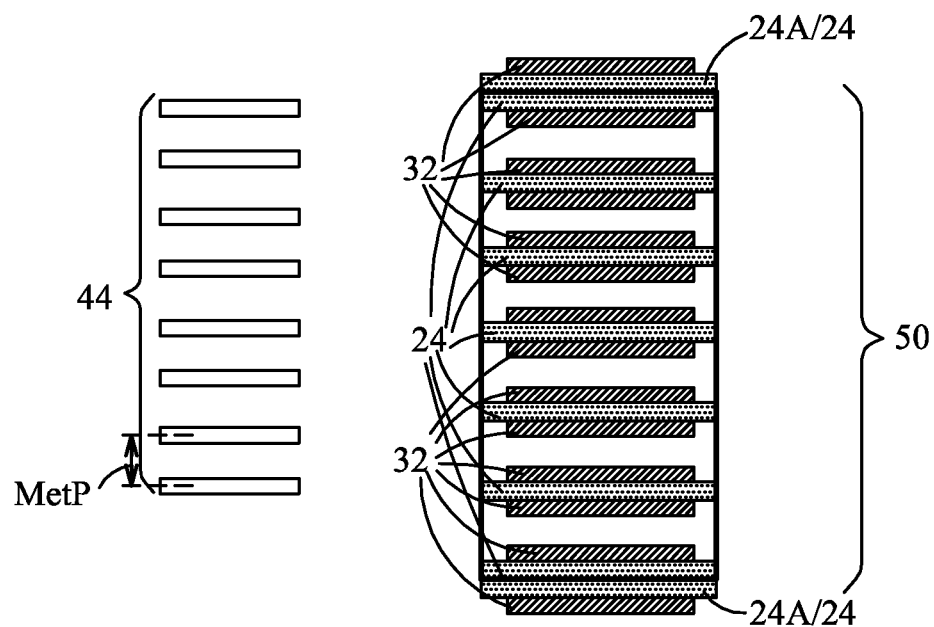
Figure 11:
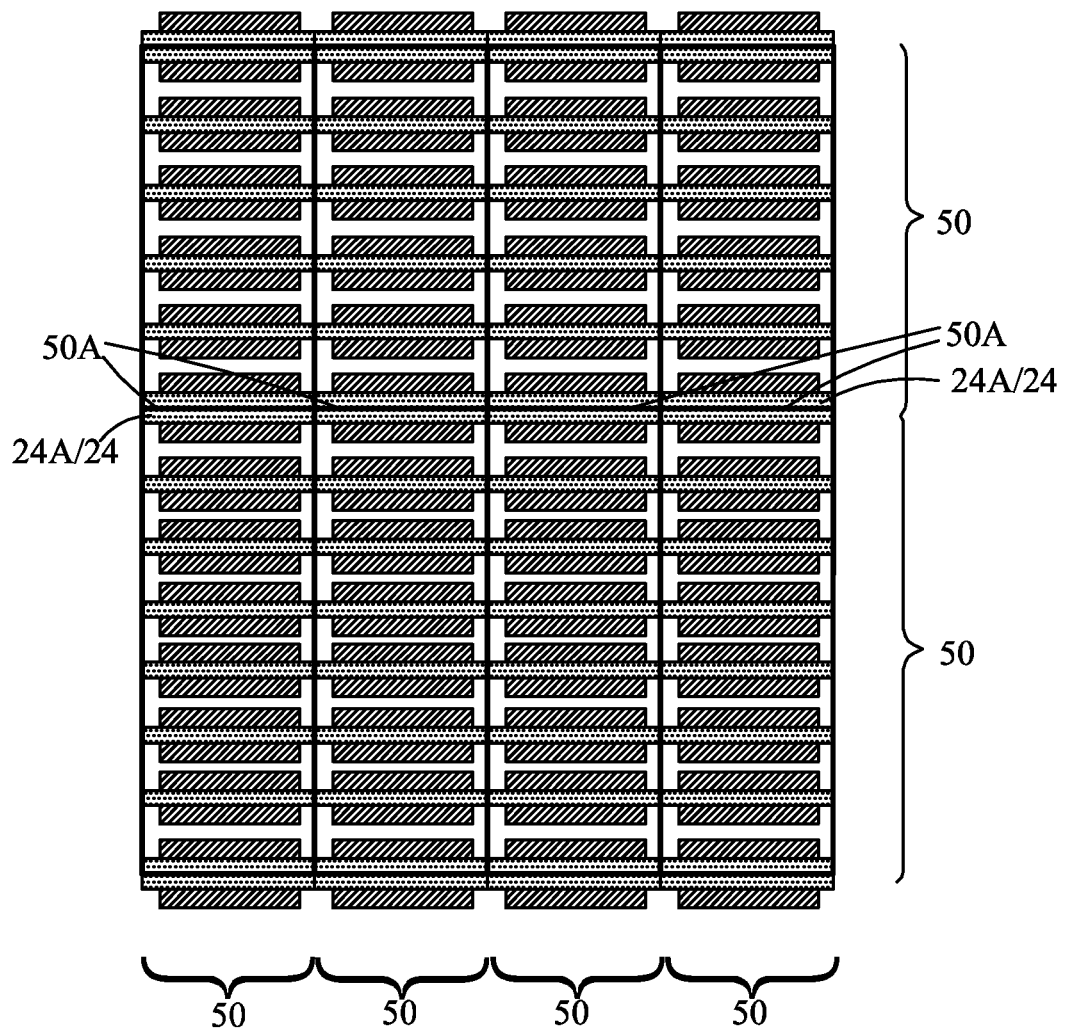
Figure 12:
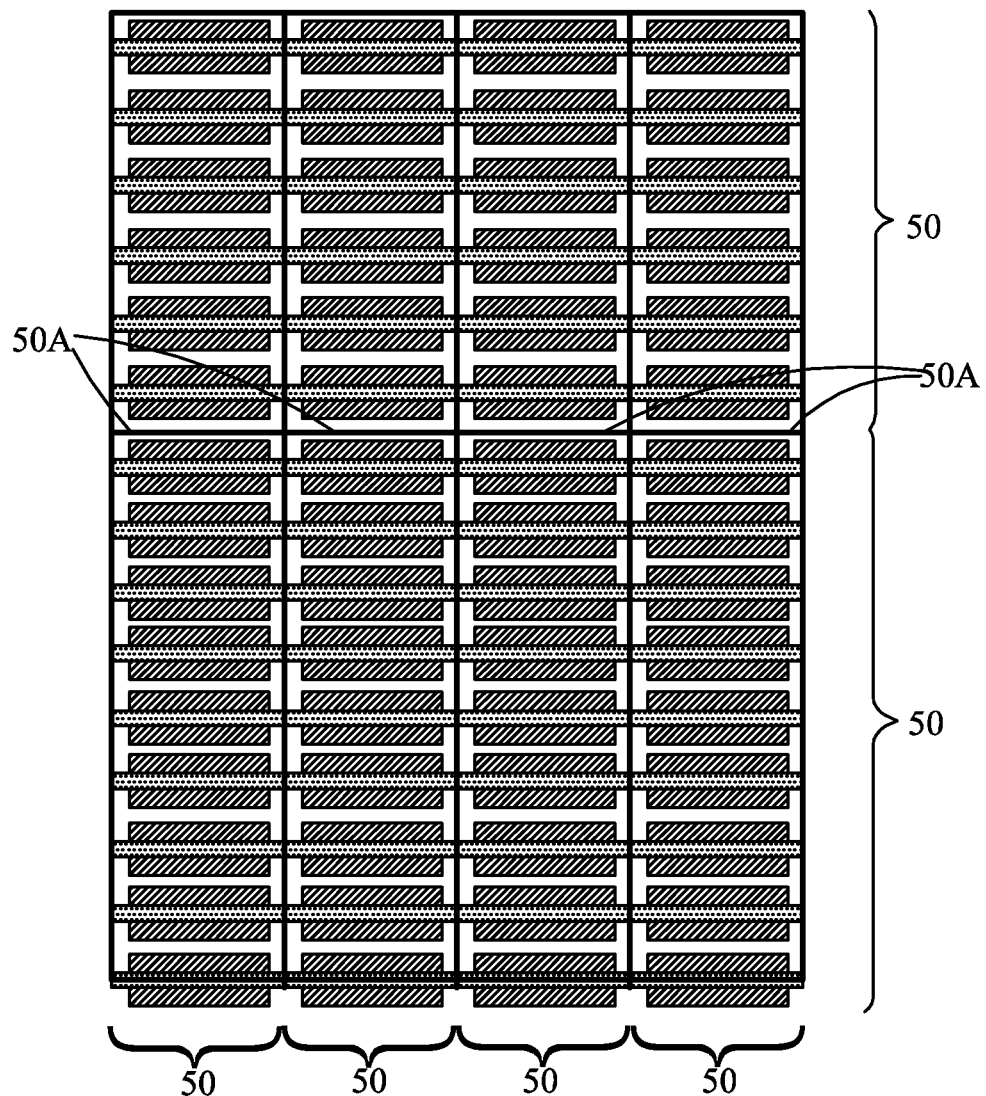

To improve the design flexibility in the cell design, for example, in the abutting scheme of neighboring cells, mandrels 24 and fins 32 may be aligned to boundaries of cell 50. For example, in FIG. 10A, the center lines of mandrel 24A and fin 32A are aligned to boundary lines 50A and 50B, respectively. In FIG. 10B, the edges of mandrels 24A and fin 32A are aligned to boundary lines 50A and/or 50B. In FIG. 10C, the center lines of boundary mandrels 24A that are wider than internal mandrels 24 inside cell 50 are aligned to boundary lines 50A and/or 50B. As a result, as shown in FIG. 11, when cells are abutted, wide mandrels 24A may be placed on boundary lines 50A of cells 50. Alternatively, as shown in FIG. 12, the spaces (with no mandrel 24 in the spaces) between neighboring fins 32 are aligned to boundary lines 50A of cells 50.

Figure 13:
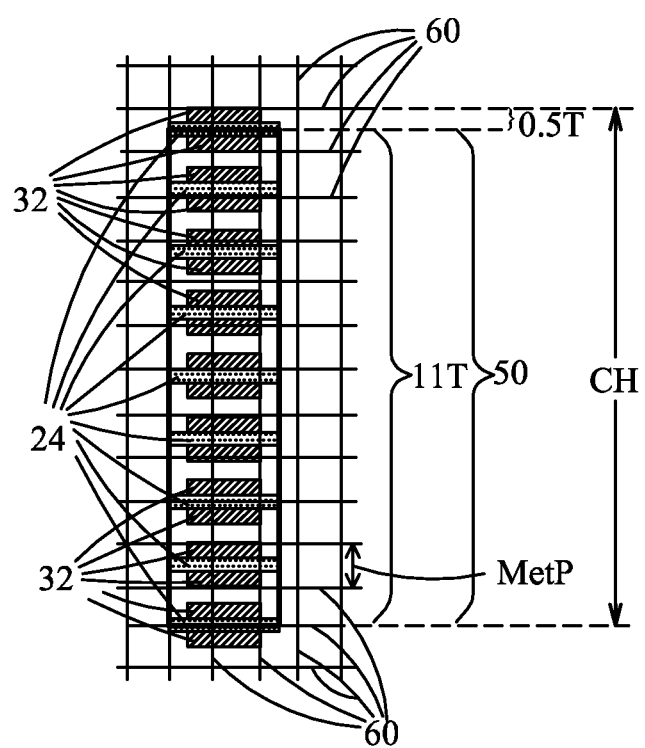

By allowing fin pitch FP not equal to metal pitch MetP, half metal pitch cell design may be achieved. FIG. 13 illustrates an exemplary embodiment wherein cell height CH equals 11.5 metal pitch MetP (also refer to FIG. 2). Lines 60 are the metal tracks that form a grid, whose pitches are equal to metal pitch MetP. The metal lines formed on the metal tracks are not shown. In an exemplary embodiment, metal pitch MetP is 64 nm. Accordingly, cell height CH is 11.5×64, and is equal to 736 nm. This cell height may accommodate up to 16 fins with fin pitch 46 nm.

In FIGS. 6 through 13, the various discussed embodiments can be combined with each other. For example, the wide mandrel 24A in FIGS. 8B and 11 may also be implemented inside, instead of being crossing the boundary of, standard cells 50 shown in FIGS. 6 through 13. Similarly, the wide spacing S2 and/or S3 in FIG. 8C may also be implemented inside, instead of being crossing the boundary of, standards cells 50 as shown in FIGS. 6 through 13. Furthermore, the wide spacings and/or wide mandrels as shown in FIGS. 8A through 8C may be implemented for each of the embodiments, regardless of whether the pitches are determined using formula-based methods, model-based, or table-based methods, and regardless of whether the mandrels are boundary mandrels or the mandrels inside standard cells.

Figure 14:
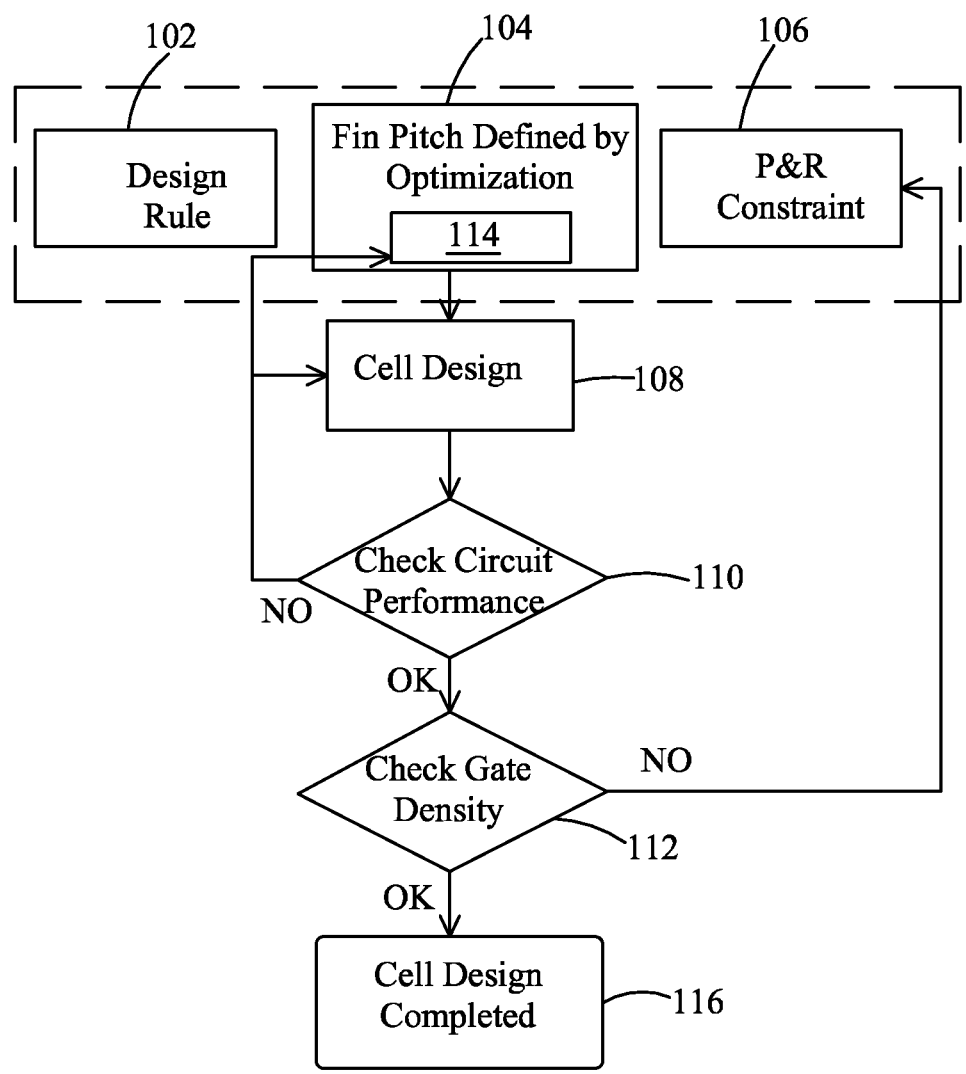
FIG. 14 illustrates a design flow of standard cells.

FIG. 14 illustrates an exemplary design flow of standard cells comprising FinFETs in accordance with embodiments. First, design rules are established (step 102). The initial fin pitch is determined (step 104). The initial fin pitch FP may be equal to or smaller than the metal pitch MetP of metal lines in bottom metal layer M1 (FIGS. 6-13). Placement and route constraints are also established (step 106). Standard cells may then be designed (step 108) according to the design rules, fin pitch FP and metal pitch MetP, and according to the placement and route constraints. In the cell design, the locations of mandrels 24 and fins 32 are determined using the operation schemes as shown in FIGS. 7A through 13 and Table 1. The pitch alignment schemes as shown in FIGS. 10A through 12 may be performed. Furthermore, wide boundary mandrels may be generated.

After the standard cells are designed, the performance of the standard cells is checked (step 110). If the performance of the cell does not meet the design requirements, the standard cells are re-designed by adding fin numbers and/or adding cells pitch numbers, so that the drive currents of FinFETs may be increased. In addition, the design flow may go back to step 114 to adjust the fin pitch, the mandrel pitch, and the like. If the performance meets the design requirement, the gate density of the standard cells is checked against design requirements (step 112). If the gate density satisfies the design requirements, the circuit design is ended. Otherwise, step 114 is performed, wherein fin pitch FP and fin number FN may be adjusted according to what are shown in FIGS. 7A through 13, Table 1, and Equations 1 through 4. In addition, cell height CH may be adjusted. For example, a cell with 10 metal tracks may be enlarged to 11 or 11.5 (as shown in FIG. 13) metal tracks to accommodate more fins if needed.

The design steps as shown in FIG. 14 may be performed manually and/or using a computer. After the design of the standard cells is finished, integrated circuits may be designed using the standard cells, and the integrated circuits are manufactured on semiconductor wafers comprising semiconductor substrates. The manufacturing processes are shown in the exemplary process steps as in FIGS. 1 through 5.

Through the above-discussed embodiments, the value of fin pitches FP may be discoupled from the value of metal pitch MetP. Accordingly, fin pitches FP may be smaller than metal pitch MetP. This allows for wide mandrel generation, hybrid fin pitch (with more than one fin pitches), and cell height modulation to half metal pitch MetP. The embodiments may be applied on the pitch determination of static random access memory (SRAM) cells, analog devices, and/or any other FinFET-containing circuits. Accordingly, standard cells 50 as illustrated in FIGS. 6 through 13 may be SRAM cells, analog cells, and/or any other FinFET-containing circuits/devices.

In accordance with embodiments, a method of designing a standard cell includes determining a minimum fin pitch of semiconductor fins in the standard cell, wherein the semiconductor fins are portions of FinFETs; and determining a minimum metal pitch of metal lines in a bottom metal layer over the standard cell, wherein the minimum metal pitch is greater than the minimum fin pitch. The standard cell is placed in an integrated circuit and implemented on a semiconductor wafer.

In accordance with other embodiments, a method of designing a standard cell includes forming mandrels over a semiconductor substrate, and forming semiconductor fins by etching the semiconductor substrate based on patterns of the mandrels, wherein the semiconductor fins are portions of the semiconductor substrate. A bottom metal layer including metal lines is formed over the semiconductor fins. The metal lines have a minimum pitch greater than a minimum pitch of the semiconductor fins.

In accordance with yet other embodiments, an integrated circuit structure includes a standard cell including semiconductor fins therein. The semiconductor fins are portions of FinFETs, and the semiconductor fins have a minimum fin pitch. The standard cell further includes metal lines in a bottom metal layer over the semiconductor fins and having a minimum metal pitch, wherein the minimum metal pitch is greater than the minimum fin pitch.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   designing a standard cell comprising:
   determining a fin pitch of semiconductor fins in the standard cell, wherein the semiconductor fins are portions of FinFETs, and wherein the fin pitch is equal to or smaller than all other pitches of the semiconductor fins in the standard cell;
   determining a grid comprising grid lines having a uniform pitch;
   determining a metal pitch of metal lines in a bottom metal layer over the standard cell to be equal to the uniform pitch, wherein the metal pitch is greater than the fin pitch, and wherein the steps of determining the fin pitch and determining the metal pitch are formula based, and are based on formula: (TN*MetP)/FP=FN, wherein TN is a metal track number of the standard cell, MetP is the metal pitch, FP is the fin pitch, and FN is a total number of semiconductor fins that can be accommodated by the standard cell; and
   aligning the metal lines to the grid lines, with neighboring metal lines having pitches equal to positive integer times the uniform pitch, wherein the metal lines are in the bottom metal layer of the standard cell; and
   implementing the standard cell on a semiconductor wafer.

2. The method of claim 1, wherein the implementing the standard cell on the semiconductor wafer comprises:
   forming mandrels over a semiconductor substrate of the semiconductor wafer;
   forming a plurality of semiconductor fins by etching the semiconductor substrate based on patterns of the mandrels, wherein the plurality of semiconductor fins are portions of the semiconductor substrate, and wherein the plurality of semiconductor fins have the fin pitch; and
   forming plurality of metal lines over the plurality of semiconductor fins, wherein the plurality of metal lines have the metal pitch.

3. The method of claim 2, wherein the mandrels comprise a first mandrel in the standard cell and having a first width, and a second mandrel in the standard cell and having a second width greater than the first width, and wherein the second mandrel is a boundary mandrel crossing a boundary of the standard cell.

4. The method of claim 3, wherein all internal ones of the mandrels inside the standard cell have the first width.

5. The method of claim 2, wherein none of the mandrels cross boundaries of the standard cell.

6. The method of claim 1, wherein the standard cell has a cell height equal to an integer times the metal pitch.

7. The method of claim 1, wherein the standard cell has a cell height equal to an integer times the metal pitch plus a half of the fin pitch.

8. The method of claim 1 further comprising, before the step of forming the standard cell, designing the standard cell comprising:
   designing the semiconductor fins having an additional fin pitch different from the fin pitch;
   determining a performance of the standard cell; and
   based on a result of the performance failing to meet design specification, re-designing the semiconductor fins to have the fin pitch.

9. The method of claim 1, wherein the positive integer is greater than 1.

* * * * *